United States Patent
Park et al.

(10) Patent No.: US 7,119,015 B2
(45) Date of Patent: Oct. 10, 2006

(54) METHOD FOR FORMING POLYSILICON PLUG OF SEMICONDUCTOR DEVICE

(75) Inventors: Hyung Soon Park, Gyeonggi-do (KR); Min Suk Lee, Gyeonggi-do (KR); Sang Ick Lee, Gyeonggi-do (KR); Hyun Chul Sohn, Gangnam-gu (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 91 days.

(21) Appl. No.: 10/879,220

(22) Filed: Jun. 30, 2004

(65) Prior Publication Data

US 2005/0142867 A1    Jun. 30, 2005

(30) Foreign Application Priority Data

Dec. 24, 2003    (KR) .................. 10-2003-0096072

(51) Int. Cl.
*H01L 21/44* (2006.01)

(52) U.S. Cl. ................ 438/672; 438/675; 257/E21.649

(58) Field of Classification Search ................ 438/692, 438/424, 672, 675; 51/306; 257/E21.649
See application file for complete search history.

(56) References Cited

U.S. PATENT DOCUMENTS

| | | | |
|---|---|---|---|
| 6,008,085 A | 12/1999 | Sung et al. | |
| 6,083,824 A | 7/2000 | Tsai et al. | |
| 6,197,630 B1 | 3/2001 | Wu et al. | |
| 6,197,682 B1 | 3/2001 | Drynan et al. | |
| 6,468,853 B1 | 10/2002 | Balasubramanian et al. | |
| 6,569,735 B1 | 5/2003 | Su | |
| 6,723,640 B1* | 4/2004 | Lee et al. | 438/672 |
| 6,740,566 B1* | 5/2004 | Lyons et al. | 438/424 |
| 6,927,168 B1* | 8/2005 | Song | 438/692 |
| 2002/0009882 A1* | 1/2002 | Shin et al. | 438/675 |
| 2004/0023496 A1* | 2/2004 | Jung et al. | 438/692 |
| 2004/0082162 A1* | 4/2004 | Kang et al. | 438/629 |
| 2004/0163324 A1* | 8/2004 | Lee et al. | 51/306 |

FOREIGN PATENT DOCUMENTS

KR    1999-0074360    10/1999
KR    1020030001086 A    1/2003

* cited by examiner

*Primary Examiner*—Matthew Smith
*Assistant Examiner*—Nicholas Tobergte
(74) *Attorney, Agent, or Firm*—Heller Ehrman LLP

(57) ABSTRACT

Disclosed is a method for forming a polysilicon plug of a semiconductor device. The method comprises the steps of: forming a stacked pattern of a wordline and a hard mask film on a semiconductor substrate comprising a cell region and a peripheral circuit region; forming a spacer on a sidewall of the stacked pattern; forming an interlayer insulating film on the semiconductor substrate; polishing the interlayer insulating film via a CMP process using the hard mask film as a polishing barrier film; forming a barrier film on the semiconductor substrate including the interlayer insulating film; selectively etching the barrier film and the interlayer insulating film to form a landing plug contact hole; depositing a polysilicon film filling the landing plug contact hole on the semiconductor substrate; blanket-etching the polysilicon film using the barrier film as an etching barrier film; and polishing the polysilicon film and the barrier film using the hard mask film as a polishing barrier film to form a polysilicon plug.

32 Claims, 10 Drawing Sheets

METHOD FOR FORMING POLYSILICON PLUG OF SEMICONDUCTOR DEVICE

BACKGROUND OF THE INVENTION

1. Field of the Invention

The present invention generally relates to a method for forming a polysilicon plug of a semiconductor device, and a method for forming a polysilicon plug of a semiconductor wherein an interlayer insulating film is polished until a hard mask film is exposed and then a barrier film is deposited on the entire surface of the hard mask film and used as a polishing barrier film when a landing plug contact hole is formed, thereby improving the margin of the hard mask film of the peripheral circuit region so that a wordline is not exposed.

2. Description of the Prior Art

FIGS. 1a to 1i are cross-sectional diagrams illustrating a conventional method for forming a polysilicon plug of a semiconductor device.

Referring to FIG. 1a, a stacked pattern of a wordline 12 and a hard mask film 14 is formed on a semiconductor substrate 10 comprising a cell region C and a peripheral circuit region P. Here, the hard mask film 14 is formed of a nitride film, and its thickness is t1.

Next, a nitride film or an oxide film (not shown) is formed on the entire surface of the resulting structure, and a spacer 16 are formed on a sidewall of the stacked pattern of the wordline 12 and the hard mask film 14 by blanket-etching the nitride film or the oxide film.

Referring to FIG. 1b, an interlayer insulating film 18 is formed by filling an oxide film such as a BPSG (boron phosphorous silicate glass) oxide film on the entire surface of the resulting structure.

Referring to FIG. 1c, a CMP process is performed only on the interlayer insulating film 18 of the cell region C while the cell region C is open by using a cell open mask in order to facilitate a subsequent planarization process by alleviating a region difference between the interlayer insulating film 18 of the cell region C and the interlayer insulating film 18 of the peripheral circuit region P.

Referring to FIG. 1d, the interlayer insulating film 18 is planarized by performing a CMP process on the entire surface of the interlayer insulating film 18 having the alleviated region difference. Here, the thickness of the planarized interlayer insulating film 18 is t2 from the hard mask film 14.

Referring to FIG. 1e, a photoresist film (not shown) is deposited on the interlayer insulating film 18, and a photoresist film pattern 20 is formed by selectively exposing and developing the photoresist film.

Referring to FIG. 1f, a landing plug contact hole is formed by selectively etching the lower interlayer insulating film 18 using the photoresist film pattern 20 as an etching mask so that the stacked pattern of the wordline 12 and the hard mask film 14 remains in the contact hole region.

As a result, the upper portion of the hard mask film 14 is partially removed because the stacked pattern is exposed when the contact is formed, and the thickness of the hard mask film 14 is reduced from t1 to t3. The interlayer insulating film 18 which remains on the cell region C is partially removed by the CMP process, and the thickness of the interlayer insulating film 18 is reduced from t2 to t4.

Thereafter, the remaining portion of the photoresist film pattern 20 after the etching process is removed using $O_2$ plasma.

Then, a capping layer (not shown) is formed by depositing a USG (Undoped Silicate Glass) film on the entire surface of the resulting structure, and the capping layer remains only on the surface of the stacked pattern by etching back the USG film so that the hard mask film 14 may not be damaged in a subsequent process.

Referring to FIG. 1g, the landing plug contact hole is filled by depositing a polysilicon film 24 on the entire surface of the resulting surface, which results in a step difference of t5 due to the previous process difference. That is, the polysilicon film 24 has the step difference of t5 in the contact, and has a thickness of t6 from the hard mask film 14.

Referring to FIG. 1h, the polysilicon film 24 is blanket-etched so that the polysilicon film 24 of the cell region C is partially removed and the polysilicon film 24 of the peripheral circuit region P is completely removed.

Referring to FIG. 1i, a CMP process is performed on the polysilicon film 24, the interlayer insulating film 18, the hard mask film 14 under the interlayer insulating film 18 of the cell region C and the interlayer insulating film 18 of the peripheral circuit region P by using the hard mask film 14 on the cell region C as a polishing barrier film until the hard mask film 14 on the cell region C is exposed. Here, the removing process is performed on the polysilicon film 24 by a thickness of t6 to separate the polysilicon film 24 into regions P1 and P2.

As a result, a polysilicon plug 26 having the completely separated regions P1 and P2 is formed. Here, the wordline is exposed by loss of the hard mask film 14 of the peripheral circuit region P. In this way, the exposed wordline causes misalignment in a subsequent process. In addition, a bridge is formed between the wordline and storage node contact or leakage current increases, which results in fail of devices.

To minimize loss of a hard mask film and secure a bottom area of an open contact are generally required when a landing plug contact hole is formed by etching an interlayer insulating film via a SAC process. Here, the loss of the hard mask film is minimized because the margin of the hard mask film resulting from a CMP process performed to form a plug by separating a deposited polysilicon film may cause fail of devices.

In order to overcome the margin problem of the hard mask film, a capping layer is formed by depositing a USG (undoped silicate glass) film having a poor step coverage before etching the hard mask film, and then an etch-back process is performed on the capping layer.

When a landing plug contact hole is formed via a SAC process using ArF as a light source, the hard mask film is lost at a thickness ranging about from 800 to 900 Å. The loss of the hard mask film reaches over about 200 Å than in a process using a KrF as a light source.

As a result, the thickness of the hard mask film becomes thicker to compensate the loss of the hard mask film, which affects the subsequent process of forming the interlayer insulating film and security of bottom CD of the contact. As described above, since the USG film is deposited to protect the hard mask film and it makes control of the thickness of the interlayer insulating film in the contact more difficult, partial contacts are not open in the conventional KrF process. Accordingly, it is important to embody a structure where a capping layer is not formed for configuration of a landing plug contact hole structure.

SUMMARY OF THE INVENTION

It is an object of the present invention to provide a method for forming a polysilicon plug of a semiconductor device which does not comprise a conventional process of forming a capping layer and improves the margin of a hard mask film of a peripheral circuit region when a CMP process is performed to separate a polysilicon film.

In an embodiment, there is provided a method for forming a polysilicon plug of a semiconductor device. The method comprises the steps of:

(a) forming a stacked pattern of a wordline and a hard mask film on a semiconductor substrate comprising a cell region and a peripheral circuit region;

(b) forming a spacer on a sidewall of the stacked pattern;

(c) forming an interlayer insulating film on the semiconductor substrate;

(d) polishing the interlayer insulating film via a CMP process using the hard mask film as a polishing barrier film;

(e) forming a barrier film on the semiconductor substrate including the interlayer insulating film;

(f) selectively etching the barrier film and the interlayer insulating film to form a landing plug contact hole;

(g) depositing a polysilicon film filling the landing plug contact hole on the semiconductor substrate;

(h) blanket-etching the polysilicon film using the barrier film as an etching barrier film; and (i) polishing the polysilicon film and the barrier film using the hard mask film as a polishing barrier film to form a polysilicon plug.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

FIGS. 2a to 2j are cross-sectional diagrams illustrating a method for forming a polysilicon plug of a semiconductor device according to an embodiment of the present invention.

Figure 1A:
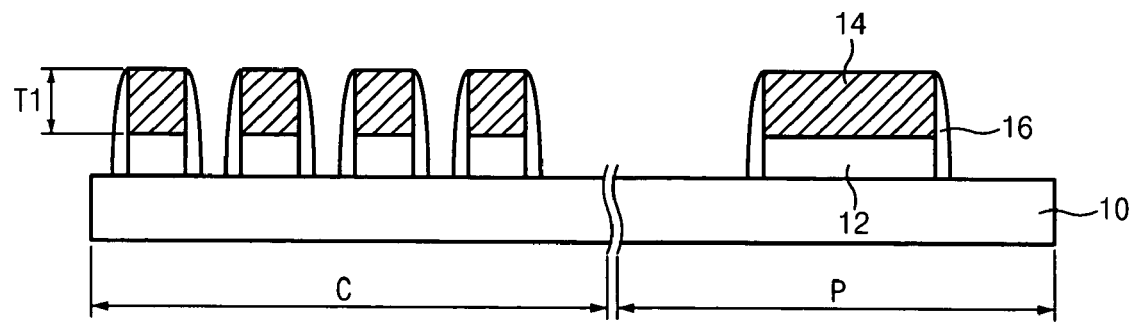
FIGS. 1a to 1i are cross-sectional diagrams illustrating a conventional method for forming a polysilicon plug of a semiconductor device.
Figure 1B:
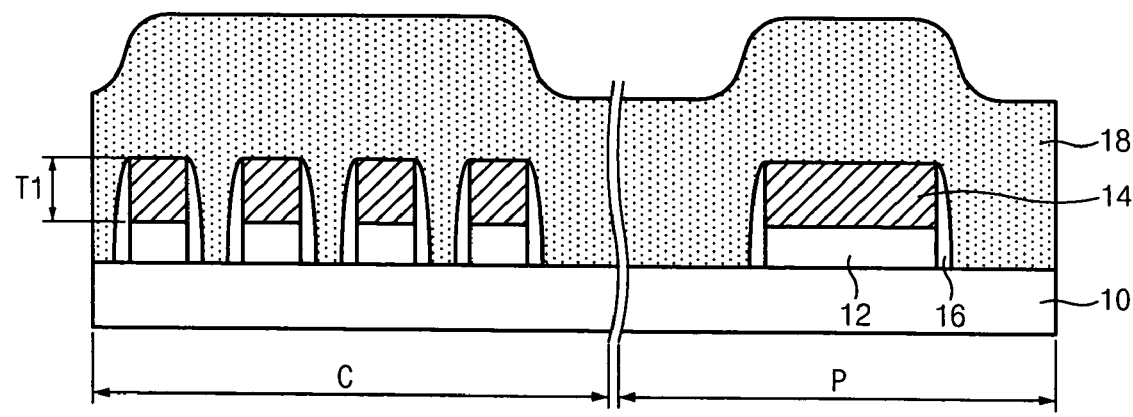
Figure 1C:
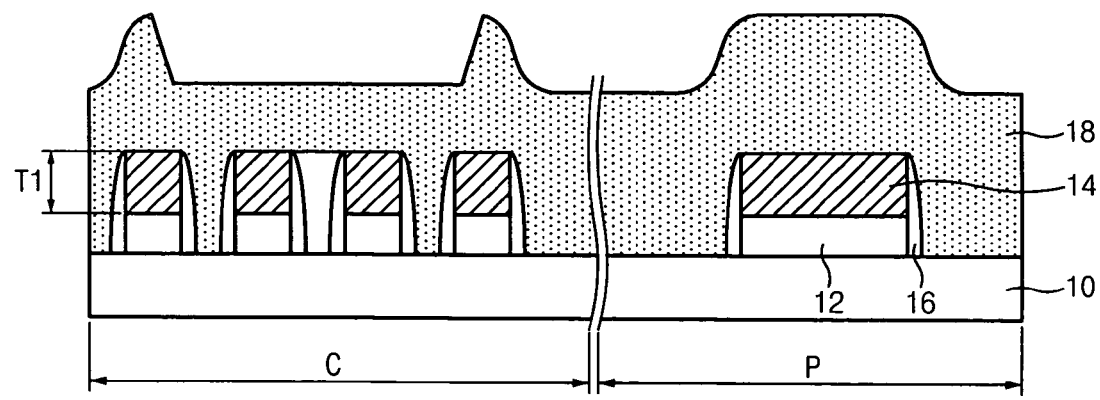
Figure 1D:
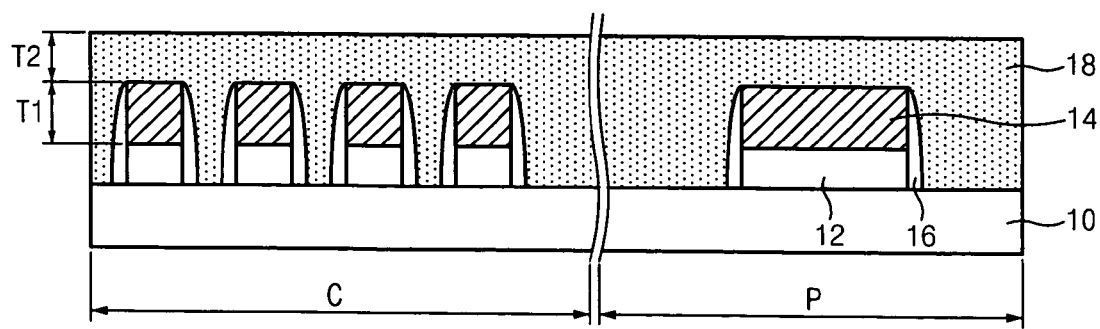
Figure 1E:
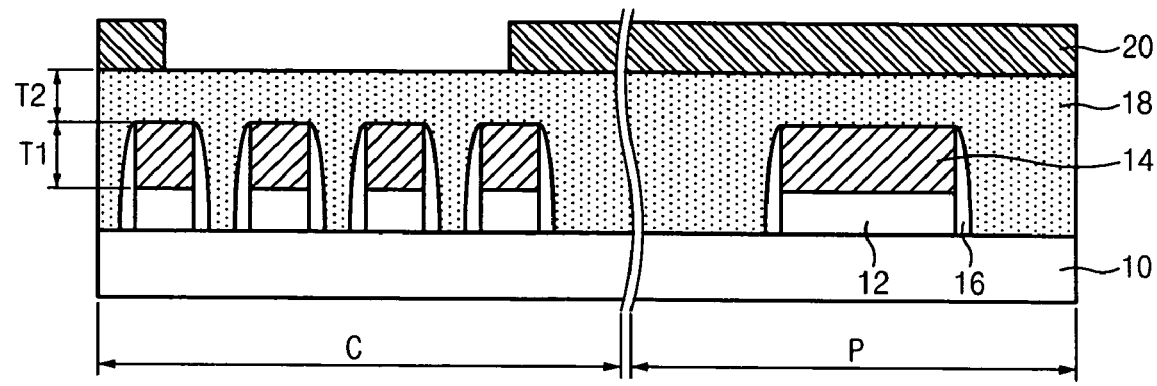
Figure 1F:
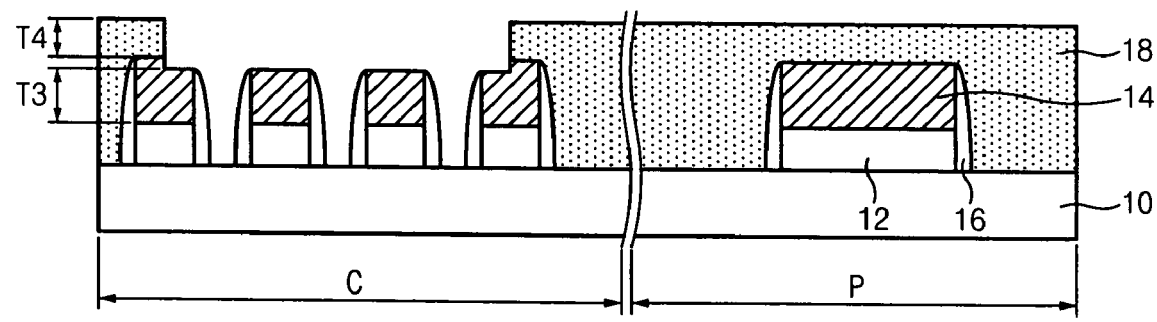
Figure 1G:
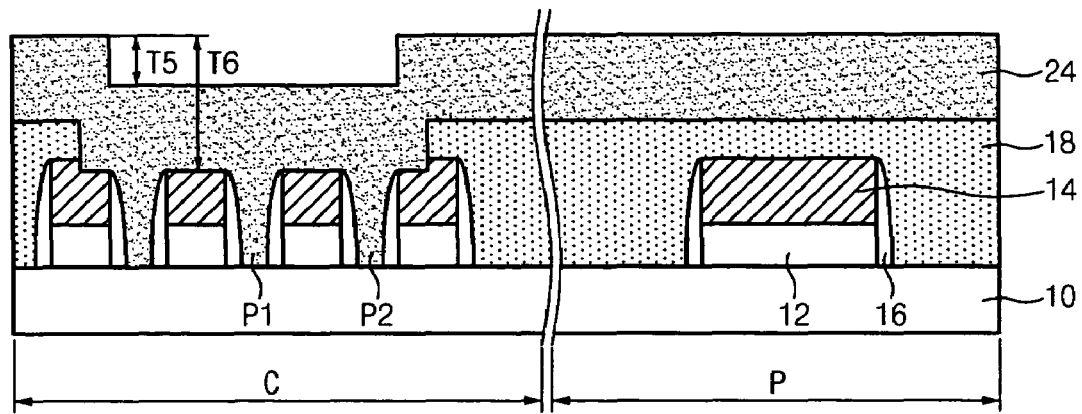
Figure 1H:
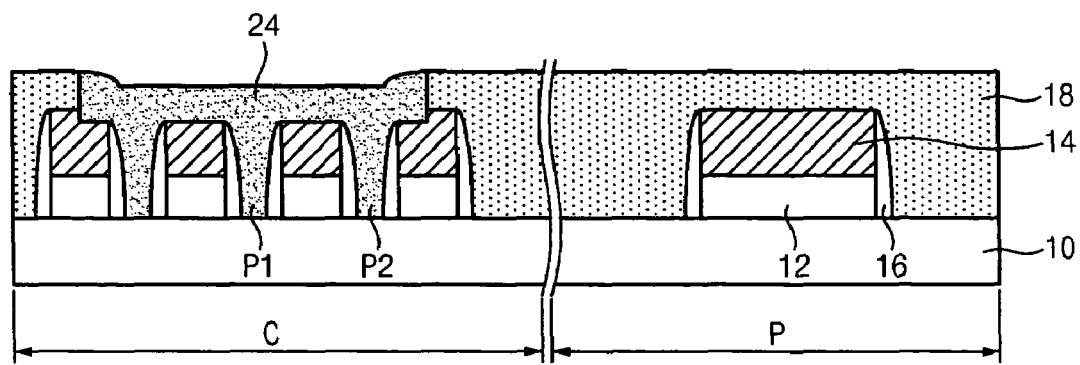
Figure 1I:
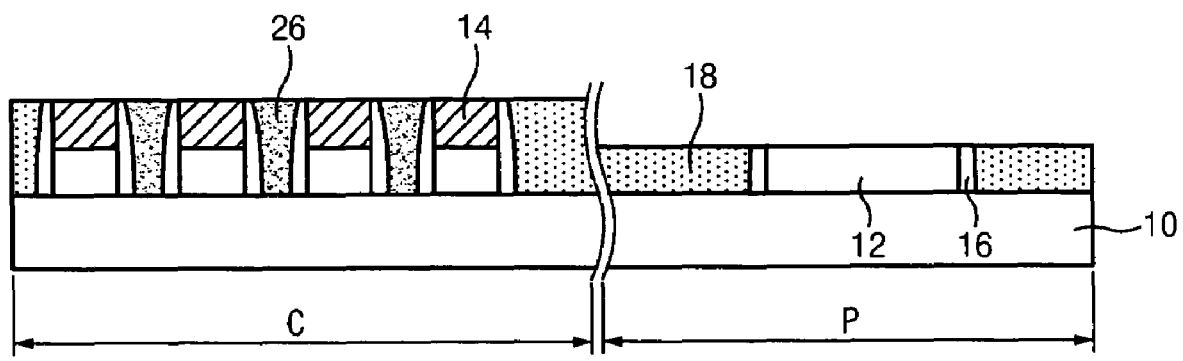
Figure 2A:
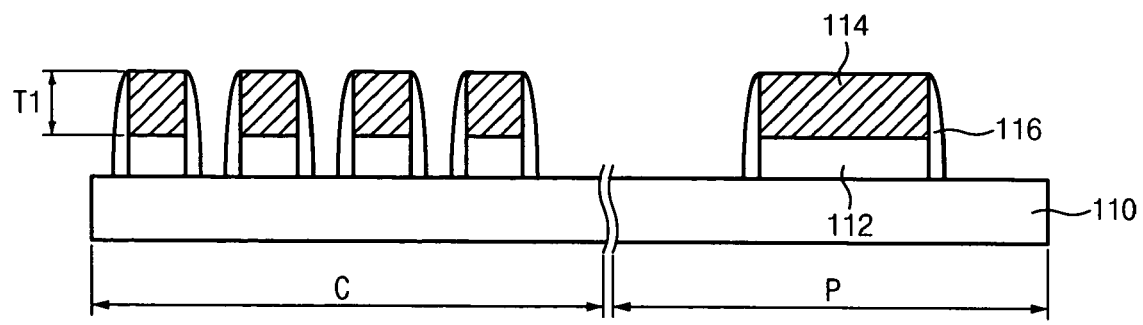
FIGS. 2a to 2j are cross-sectional diagrams illustrating a method for forming a polysilicon plug of a semiconductor device according to an embodiment of the present invention.

Referring to FIG. 2a, a stacked pattern of a wordline 112 and a hard mask film 114 is formed on a semiconductor substrate 110 comprising a cell region C and a peripheral circuit region P.

The wordline 112 is preferably formed of a polysilicon film, a doped polysilicon film, $WSi_x$ film, a WN film, a W film or a TiSix film.

The hard mask film 114 as a $Si_3N_4$ film is preferably formed via a LP-CVD (low pressure chemical vapor deposition) method using $SiH_2Cl_2$ and $NH_3$ as a source. The LP-CVD method may improve the margin of a SAC process and alleviate stress resulting from leakage current by removing micro void formed between an interlayer insulating film and a polysilicon film which are formed in a subsequent process. Furthermore, the hard mask film 114 is also formed via a PE-CVD (plasma enhanced chemical vapor deposition) method using $SiH_4$ and $NH_3$ as a source. The hard mask film 114 has a thickness of t1 ranging from 300 to 3000 Å.

Next, a nitride film (not shown) and an oxide film (not shown) are sequentially formed on the entire surface of the resulting structure, and a spacer 116 having a stacked structure of nitride film and oxide film are formed on the sidewall of the stacked pattern by blanket-etching the nitride film and the oxide film.

Figure 2B:
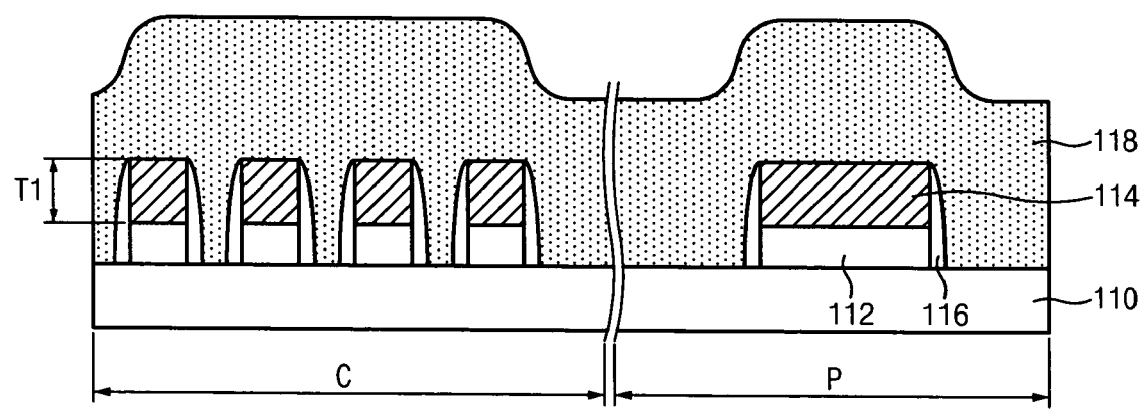

Referring to FIG. 2b, an interlayer insulating film 118 is formed by filling an oxide film on the entire surface of the resulting structure. Here, the interlayer insulating film 118 is selected from a group consisting of a doped oxide film such as a BPSG (boron phosphorous silicate glass) oxide film having an excellent filling characteristic and a PSG (phosphorous silicate glass) oxide film, an APL (advanced planarization layer) oxide film having fluidity via a LP-CVD method using $H_2O_2$ and $SiH_4$ as a reaction source, an ALD (atomic layer deposition) oxide film and a SOD (spin on dielectric) oxide film. The thickness of the interlayer insulating film 118 is preferably deposited 1.1 times to 5 times thicker than the stacked pattern of the wordline 112 and the hard mask film 114.

Figure 2C:
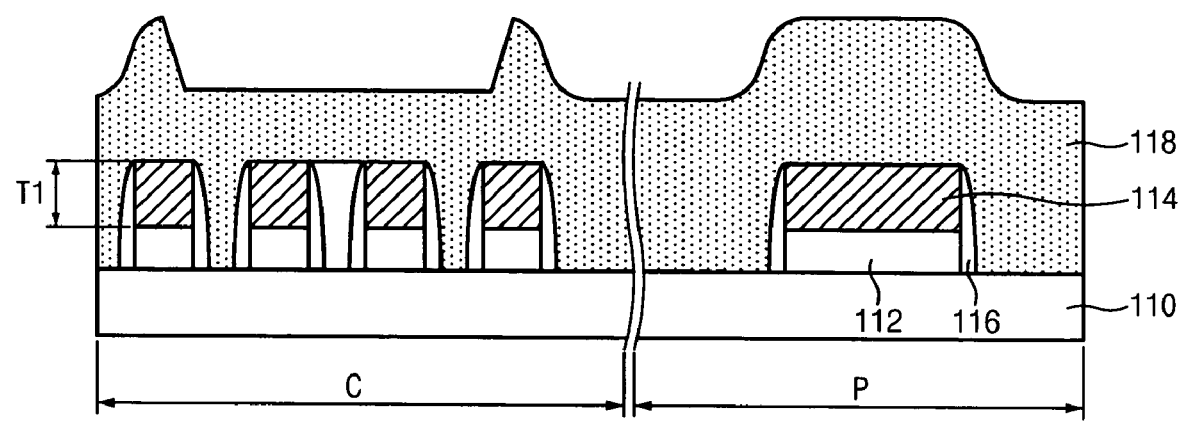

Referring to FIG. 2c, a CMP process is performed only on a cell region C using a cell open mask to facilitate a subsequent process of planarizing the interlayer insulating film 118 by alleviating a region difference between the cell region C and the peripheral circuit region P.

When the interlayer insulating film 118 is formed 1.1 times to 2 times thicker than the stacked pattern in the previous process, the CMP process using a cell open mask may be omitted.

Figure 2D:
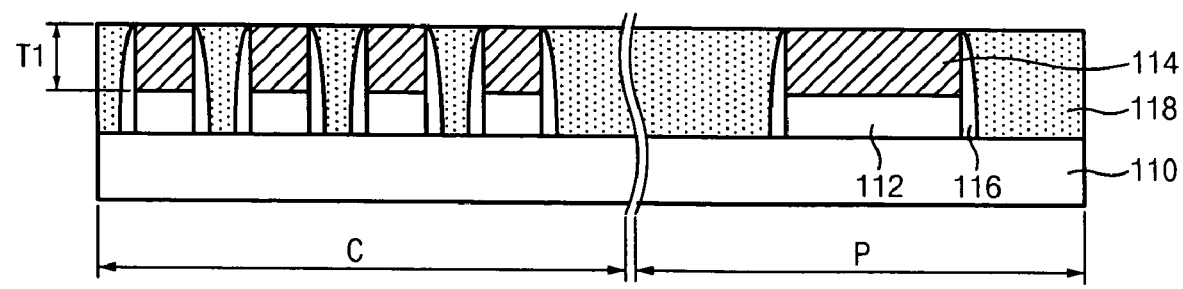

Referring to FIG. 2d, a CMP process is performed on the interlayer insulating film 118 using the hard mask film 114 as a polishing barrier film until the hard mask film 114 is exposed.

Here, in order to minimize loss of the hard mask film 114 the CMP process may be performed in various ways described below.

First, the interlayer insulating film 118 may be removed by using a slurry for oxide film, the slurry having a pH ranging from 8 to 12 and containing an abrasive having a particle size ranging from 10 to 800 nm until the hard mask film is exposed. Here, the abrasive is selected from a group consisting of $SiO_2$, $CeO_2$, $Al_2O_3$, $ZrO_2$ or combinations thereof.

Second, the interlayer insulating film 118 may be removed by using a slurry, the slurry having a pH ranging from 4 to 10, on oxide film to nitride film polishing selectivity of 1~500:1 and containing an abrasive having a particle size ranging from 10 to 800 nm until the hard mask film is exposed. Here, the abrasive is selected from a group consisting of $SiO_2$, $CeO_2$, $Al_2O_3$, $ZrO_2$ or combinations thereof.

When the CMP process is performed by using a slurry having the similar polishing selectivity to the oxide film and the nitride film, dishing in the interlayer insulating film 118 between the stacked patterns of the wordlines 112 and the hard mask films 114 decreases, thereby eliminating defects.

Third, a first CMP process is performed using a slurry for an oxide film, the slurry having a pH ranging from 8 to 12 and containing an abrasive having a particle size ranging from 10 to 800 nm to remove the interlayer insulating film 118 on the hard mask film 114 at a 0.1~99.9% thickness, thereby removing a step difference. Here, the abrasive is selected from a group consisting of $SiO_2$, $CeO_2$, $Al_2O_3$, $ZrO_2$ or combinations thereof. Then, a second CMP process is performed using a slurry, the slurry having a pH ranging from 4 to 10, on oxide film to nitride film having a polishing selectivity of 1~500:1 and containing an abrasive having a particle size ranging from 10 to 800 nm to remove the remaining portion of the interlayer insulating film 118. Here, the abrasive is selected from a group consisting of $SiO_2$, $CeO_2$, $Al_2O_3$, $ZrO_2$ or combinations thereof.

In the above-described way, when the CMP process is performed through the two steps, the first and second CMP processes are performed in a first platen and a second platen in a wetting state via an in-Situ method or in a first CMP equipment and a second CMP equipment.

Fourth, the interlayer insulating film 118 may be removed by using a slurry of having a pH ranging from 1 to 9 and containing colloidal silica.

When the CMP process is performed by using the slurry having a pH ranging from 1 to 9 and containing colloidal silica, dishing in the interlayer insulating film 118 between the stacked patterns of the wordlines 112 and the hard mask films 114 decreases, thereby eliminating defects.

Fifth, after a CMP process is performed to prevent generation of scratch so that the predetermined thickness of the interlayer insulating film 118 may remain on the hard mask film 114. Then, a blanket-etching process is performed to remove the remaining portion of the interlayer insulating film 118 until the hard mask film 114 is exposed.

Sixth, after a CMP process is performed to prevent generation of scratch so that the predetermined thickness of the interlayer insulating film 118 may remain on the hard mask film 114, a blanket-etching process and a wet-etching process are performed on the remaining portion of the interlayer insulating film 118 until the hard mask film 114 is exposed.

After the above-described CMP processes are performed, a post cleaning process is further performed using $NH_3$, HF or SC-1($NH_4OH+H_2O_2+H_2O$).

Figure 2E:
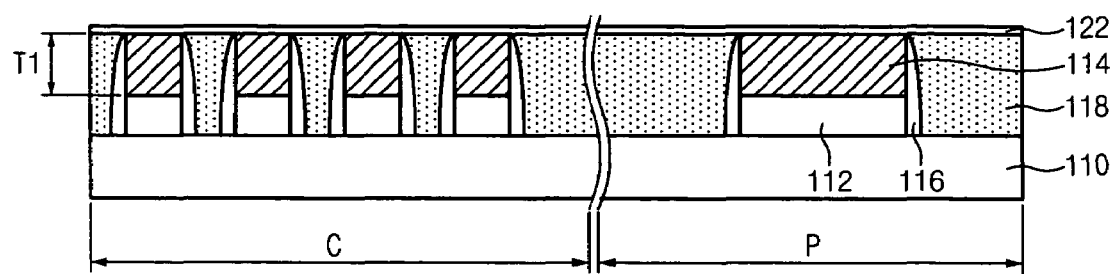

Referring to FIG. 2e, a barrier film 122 is formed on the entire surface of the resulting structure by depositing on a polysilicon film, a $Si_3N_4$ film, a $SiO_xN_y$ film, a tungsten film or a tungsten alloy film.

In this way, since the barrier film 122 is formed after the interlayer insulating film 118 is completely removed on the hard mask film 114, the lifting phenomenon of the barrier film 122 is originally prevented.

Figure 2F:
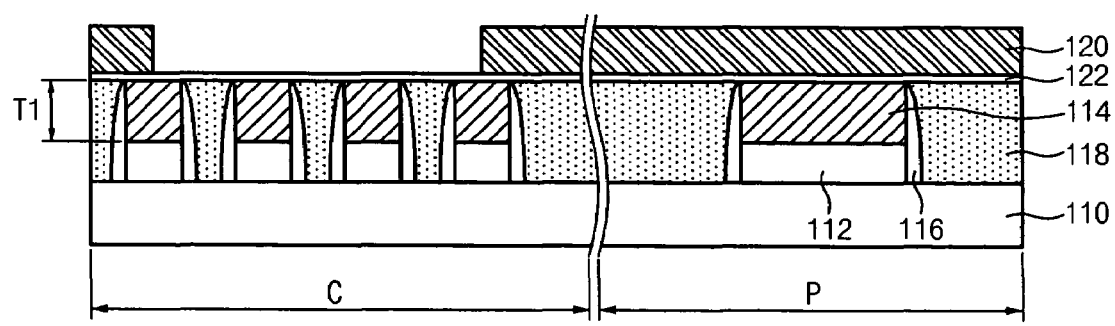

Referring to FIG. 2f, a photoresist film (not shown) is deposited on the barrier film 122, and then a photoresist film pattern 120 is formed by selectively exposing and developing the photoresist film.

Figure 2G:
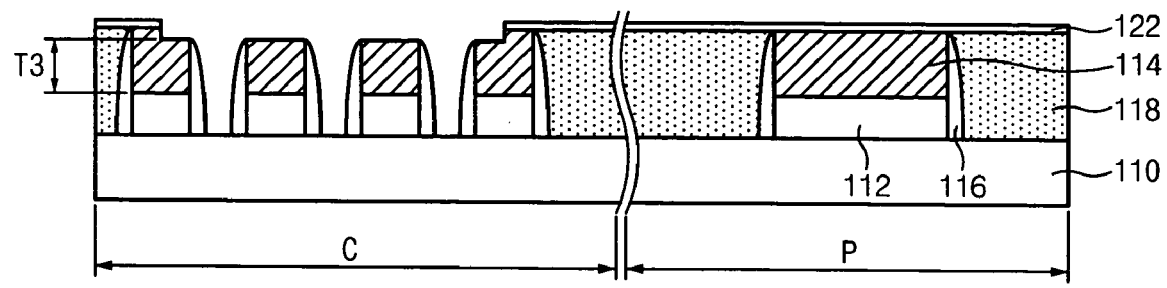

Referring FIG. 2g, a landing plug contact hole is formed by selectively etching the lower barrier film 122 and the interlayer insulating film 118 using the photoresist film pattern 120 as an etching mask.

Specifically, the process of forming a landing plug contact hole is described as follows. A barrier film pattern (not shown) is formed by selectively etching the barrier film 122 using the photoresist film pattern 120 as an etching mask. Thereafter, the photoresist film pattern 122 is removed by using $O_2$ plasma. Then, a self-alignment process using the barrier film pattern as an etching mask is performed to remove the interlayer insulating film 118 between the stacked patterns by using a gas selected from a group consisting of $C_4F_8$, $C_4F_6$ and $C_5F_8$ as a source to generate a large amount of $CF_2$ radical, thereby forming a landing plug contact hole.

Here, the process of forming a landing plug contact hole may be performed in a single chamber via an in-situ method. Otherwise, the processes of forming the photoresist film pattern 120, of forming the barrier film pattern and of removing the photoresist film pattern 120 may be performed in a first chamber, and the process of forming the landing plug contact hole may be performed in a second chamber.

As a result, since the stacked pattern is exposed in the process of forming a contact, the partial upper portion of the hard mask film 114 is removed, and the thickness of the hard mask film 114 is reduced from t1 to t3.

In this way, the thickness of the photoresist film can be reduced by using the pattern of the barrier film 122 as well as the photoresist film pattern 120 in the process of forming the contact, thereby securing the margin of the photo process. As a result, the embodiment of fine patterns is facilitated, the collapse phenomenon of patterns is reduced, and CD (critical dimension) is improved. Additionally, since the loss of the hard mask film 114 decreases by the above-described processes, it is not necessary to form a capping layer in the conventional method, thereby preventing the fail where the contact is not open.

Furthermore, since the thickness of the hard mask film 114 can be reduced by using the barrier film 122 as an etching barrier film in the process of forming the landing plug contact hole, the height of the stacked pattern of the wordline 112 and the hard mask film 114, thereby improving a filling characteristic when the interlayer insulating film 118 is formed of a BPSG oxide film and minimizing dishing of the interlayer insulating film 118 formed between the stacked patterns of the wordlines 112 and the hard mask films 114. As a result, the contact hole region can be precisely defined.

Figure 2H:
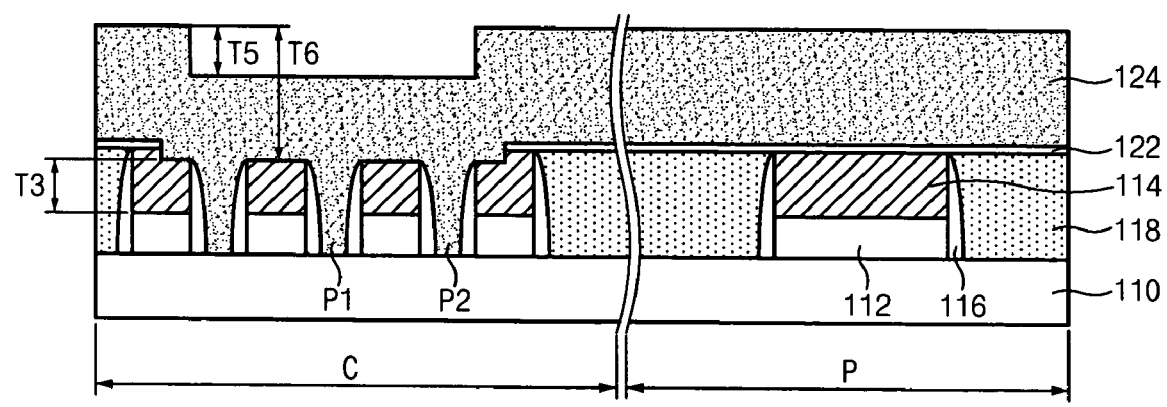

Referring to FIG. 2h, the landing plug contact hole is filled by depositing a polysilicon film 124 on the entire surface of the resulting structure at a thickness ranging from 1000 to 10000 Å. As a result, a step difference of t5 is generated by the difference of the previous process. That is, the polysilicon film 124 has the step difference of t5 in the contact, and has a thickness of t6 from the hard mask film 114.

Preferaly, the polysilicon film 124 is a doped polysilicon film formed via an in-situ doping process using $SiH_4$ or $Si_2H_6$ as a source or a polysilicon film formed via a SEG (Selective Epitaxial Growing) process.

Figure 2I:
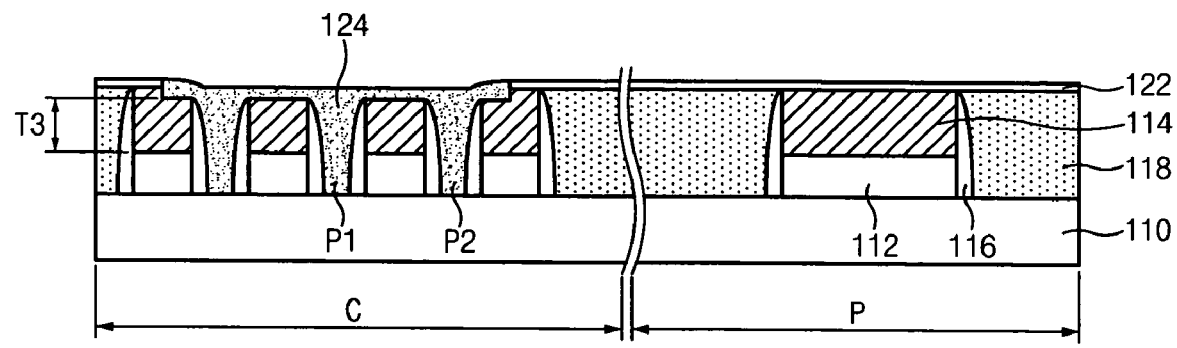

Referring to FIG. 2i, the polysilicon film 124 is blanket-etched using the barrier film 122 as an etching barrier film until the barrier film 122 is exposed. Here, when the CMP process is used to separate the polysilicon film 124, the polysilicon film 124 is blanket-etched until the barrier film 122 is exposed. However, when the blanket-etching process is performed to separate to the polysilicon film 124, the polysilicon film 124 is removed by removing the whole barrier film 122.

The CMP process may be used instead of the blanket-etching process on the polysilicon film 124 using the barrier film 122 as an etching barrier film. The CMP process is performed on the entire surface of the resulting structure using the hard mask film 114 on the cell region C as a polishing barrier film so that the polysilicon film 124 may be separated by a subsequent CMP process at the same time until the hard mask film 114 is exposed.

Figure 2J:
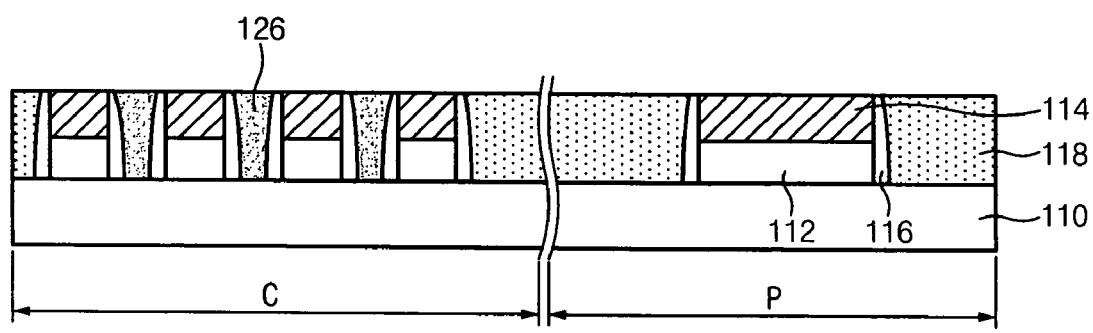

Referring to FIG. 2j, when the polysilicon film 124 is blanket-etched using the barrier film 122 as an etching barrier film, the CMP process is performed on the entire surface of the resulting structure using the hard mask film 114 on the cell region C as a polishing barrier film, thereby separating the polysilicon film 124 to form a polysilicon plug 126. Here, the process of removing the polysilicon film 124 by t6 is required so that the polysilicon film 124 may be separated into regions P1 and P2.

As a result, the polysilicon plug 126 having the completely separated regions P1 and P2 is formed. Here, loss of the hard mask film 114 of the peripheral circuit region P is not generated so that the wordline 112 is not exposed.

Here, the CMP process may be performed in various ways as follows.

First, the polysilicon film 124, the barrier film 122 and the hard mask film 114 may be removed by using a slurry for oxide film, the slurry having a pH ranging from 8 to 12 and containing an abrasive having a particle size ranging from 10 to 800 nm until the hard mask film 114 on the cell region C is exposed. Here, the abrasive is selected from a group consisting of $SiO_2$, $CeO_2$, $Al_2O_3$, $ZrO_2$ or combinations thereof.

Second, the polysilicon film 124, the barrier film 122 and the hard mask film 114 may be removed by using a slurry, the slurry having a pH ranging from 4 to 10, an oxide film to nitride film polishing selectivity of 1~500:1 and containing an abrasive having a particle size ranging from 10 to 800 nm until the hard mask film 114 on the cell region C is exposed. Here, the abrasive is selected from a group consisting of $SiO_2$, $CeO_2$, $Al_2O_3$, $ZrO_2$ or combinations thereof.

When the CMP process is performed by using a slurry having the similar polishing selectivity to the oxide film and the nitride film, dishing in the polysilicon film 124 between the stacked patterns of the wordlines 112 and the hard mask films 114 decreases, thereby eliminating defects.

Third, a first CMP process is performed using a slurry for oxide film to remove the polysilicon film 124. Then, a second CMP process is performed using a slurry having an on oxide film to nitride film polishing selectivity of 1~500:1 to remove the polysilicon film 124, the barrier film 122 and the hard mask film 114 until the hard mask film 114 on the cell region C is exposed.

Fourth, a first CMP process is performed using a slurry for polysilicon film to remove the polysilicon film 124. Then, a second CMP process is performed using a slurry having an oxide film to nitride film polishing selectivity of 1~500:1 to remove the polysilicon film 124, the barrier film 122 and the hard mask film 114 until the hard mask film 114 on the cell region C is exposed.

Fifth, a first CMP process is performed using a slurry for polysilicon film to remove the polysilicon film 124. Then, a second CMP process is performed using a slurry for oxide film to remove the polysilicon film 124, the barrier film 122 and the hard mask film 114 until the hard mask film 114 on the cell region C is exposed.

In the above-described third to fifth ways, when the CMP process is performed through the two steps, the first and second CMP processes are performed in a first platen and a second platen via an in-Situ method or in a first CMP equipment and a second CMP equipment.

Sixth, the polysilicon film 124, the barrier film 122 and the hard mask film 114 may be removed by using a slurry having a pH ranging from 1 to 9 and containing colloidal silica until the hard mask film 114 on the cell region C is exposed.

When the CMP process is performed using the slurry having a pH ranging from 1 to 9 and containing colloidal silica, dishing in the polysilicon film 124 between the stacked patterns of the wordlines 112 and the hard mask films 114 decreases, thereby eliminating defects.

After the above-described CMP processes are performed, a post cleaning process preferably is further performed using $NH_3$, HF or SC-1 ($NH_4OH+H_2O_2+H_2O$).

Accordingly, in an embodiment of the present invention, a contact having a T-type, an I-type or a circular type may be formed by performing the above-described process of forming a landing plug contact hole.

As discussed earlier, in an embodiment of the present invention, an interlayer insulating film is polished until a hard mask film is exposed and then a barrier film is deposited on the entire surface of the hard mask film and used as a polishing barrier film when a landing plug contact hole is formed, thereby improving the margin of the hard mask film of the peripheral circuit region so that a wordline is not exposed. As a result, misalignment is not generated in a subsequent process, a bridge between a wordline and a storage node contact is not formed, and leakage current is not generated, thereby preventing fail of devices.

What is claimed is:

1. A method for forming a polysilicon plug of a semiconductor device, comprising the steps of:
   (a) forming a stacked pattern of a wordline and a hard mask film on a semiconductor substrate comprising a cell region and a peripheral circuit region;
   (b) forming a spacer on a sidewall of the stacked pattern;
   (c) forming an interlayer insulating film on the semiconductor substrate;
   (d) polishing the interlayer insulating film via a CMP process until the hard mask film is exposed to planarize an entire surface of the resulting structure;
   (e) forming a barrier film on the planarized entire surface of the exposed hard mask film and the interlayer insulating film;
   (f) selectively etching the barrier film and the interlayer insulating film to form a landing plug contact hole;
   (g) depositing a polysilicon film filling the landing plug contact hole on the semiconductor substrate;
   (h) blanket-etching the polysilicon film using the barrier film as an etching barrier film; and
   (i) polishing the polysilicon film and the barrier film using the hard mask film as a polishing barrier film to form a polysilicon plug.

2. The method according to claim 1, wherein the wordline comprises a film selected from a group consisting of a polysilicon film, a doped polysilicon film, a $WSi_x$ film, a WN film, a W film and $TiSi_x$ film.

3. The method according to claim 1, wherein the hard mask film comprises a $Si_3N_4$ film formed via a LP-CVD (low pressure chemical vapor deposition) method using $SiH_2Cl_2$ and $NH_3$ as a source or via a PE-CVD (plasma enhanced chemical vapor deposition) method using $SiH_4$ and $NH_3$ as a source.

4. The method according to claim 1, wherein a thickness of the hard mask film ranges from 300 to 3000 Å.

5. The method according to claim 1, wherein the spacer comprises as a stacked structure of nitride film and oxide film.

6. The method according to claim 1, wherein the interlayer insulating film is selected from a group consisting of a BPSG (boron phosphorous silicate glass) oxide film, a PSG (phosphorous silicate glass) oxide film, an APL (advanced planarization layer) oxide film, an ALD (atomic layer deposition) oxide film and a SOD (spin on dielectric) oxide film.

7. The method according to claim 1, wherein the interlayer insulating film ranges from 1.1 to 5 times in thickness of the stacked pattern.

8. The method according to claim 1, wherein the step (d) is performed using a slurry for oxide film, the sluny having a pH ranging from 8 to 12 and containing an abrasive having a particle size ranging from 10 to 800 nm.

9. The method according to claim 8, wherein the abrasive is selected from a group consisting of $SiO_2$, $CeO_2$, $Al_2O_3$, $ZrO_2$ and combinations thereof.

10. The method according to claim 1, wherein the step (d) is performed using a slurry, the slurry having a pH ranging from 4 to 10, oxide film to nitride film polishing selectivity of 1~500:1 and containing an abrasive having a particle size ranging from 10 to 800 nm.

11. The method according to claim 10, wherein the abrasive is selected from a group consisting of $SiO_2$, $CeO_2$, $Al_2O_3$, $ZrO_2$ and combinations thereof.

12. The method according to claim 1, wherein the step (d) comprises: (1) a first CMP process using a slurry for an oxide film, the slurry having a pH ranging from 8 to 12 and containing an abrasive having a particle size ranging from 10 to 800 nm to remove 0.1~99.9% of thickness of the interlayer insulating film on the hard mask film, and (2) a second CMP process using a slurry, the sluny having a pH ranging from 4 to 10, oxide film to nitride film polishing selectivity of 1~500:1 and containing an abrasive having a particle size ranging from 10 to 800 nm to remove the remaining portion of the interlayer insulating film.

13. The method according to claim 12, wherein the abrasive is selected from a group consisting of $SiO_2$, $CeO_2$, $Al_2O_3$, $ZrO_2$ and combinations thereof.

14. The method according to claim 1, wherein the step (d) is performed using a sluny having a pH ranging from 1 to 9 and containing a colloidal silica to expose the hard mask film on the cell region.

15. The method according to claim 1, wherein the step (d) comprises performing a CMP process to polish a predetermined thickness of the interlayer insulating film, and blanket-etching a remaining portion of the interlayer insulating film to expose the hard mask film.

16. The method according to claim 1, wherein the step (d) comprises performing a CMP process to polish a predetermined thickness of the interlayer insulating film, and blanket-etching and a wet-etching a remaining portion of the interlayer insulating film to expose the hard mask film.

17. The method according to claim 1, wherein the barrier film is selected from a group consisting of a polysilicon film, a $Si_3N_4$ film, a $SiO_xN_y$ film, a tungsten film and a tungsten alloy film.

18. The method according to claim 1, wherein the step (f) comprises:
(i) forming a photoresist film pattern on the barrier film;
(ii) selectively etching the barrier film using the photoresist film pattern as an etching mask to form a barrier film pattern;
(iii) removing the photoresist film pattern; and
(iv) performing a SAC process using the barrier film pattern as an etching mask to form the landing plug contact hole.

19. The method according to claim 18, wherein the steps (i) through (iv) are performed in-situ in a single chamber.

20. The method according to claim 18, wherein the steps (i) through (iii) are performed in a first chamber, and the step (iv) is performed in a second chamber.

21. The method according to claim 18, wherein the step (iv) is performed using a gas selected from a group consisting of $C_4F_8$, $C_4F_6$ and $C_5F_8$ as a source.

22. The method according to claim 1, wherein the polysilicon film is formed via an in-situ doping process or a SEG (Selective Epitaxial Growing) process.

23. The method according to claim 1, wherein a thickness of the polysilicon film ranges from 1000 to 10000 Å.

24. The method according to claim 1, wherein the step (i) comprises a CMP process employing a slurry for oxide film, the slurry having a pH ranging from 8 to 12 and containing an abrasive having a particle size ranging from 10 to 800 nm.

25. The method according to claim 24, wherein the abrasive is selected from a group consisting of $SiO_2$, $CeO_2$, $Al_2O_3$, $ZrO_2$ and combinations thereof.

26. The method according to claim 1, wherein the step (i) comprises a CMP process employing a slurry, the slurry having a pH ranging from 4 to 10, an oxide film to nitride film polishing selectivity of 1~500:1 and containing an abrasive having a particle size ranging from 10 to 800 nm.

27. The method according to claim 26, wherein the abrasive is selected from a group consisting of $SiO_2$, $CeO_2$, $Al_2O_3$, $ZrO_2$ and combinations thereof.

28. The method according to claim 1, wherein the step (i) comprises (1) a first CMP process using a slurry for oxide film to remove predetermined thickness of the polysilicon film, and (2) a second CMP process performed using a slurry having an oxide film to nitride film polishing selectivity of 1~500:1 to expose the hard mask film on the cell region.

29. The method according to claim 1, wherein the step (i) comprises (1) a first CMP process using a slurry for polysilicon film to remove predetermined thickness of the polysilicon film, and (2) a second CMP process performed using a slurry having an oxide film to nitride film polishing selectivity of 1~500:1 to expose the hard mask film on the cell region.

30. The method according to claim 1, wherein the step (i) comprises (1) a first CMP process is using a slurry for oxide film to remove predetermined thickness of the polysilicon film, and (2) a second CMP process is performed using a slurry for oxide film to expose the hard mask film on the cell region.

31. The method according to claim 1, wherein the step (i) is performed using a slurry of having a pH ranging from 1 to 9 and containing a colloidal silica to expose the hard mask film on the cell region.

32. The method according to claim 1, further comprising, after the step (d) or (i), a post cleaning process using $NH_3$, HF or SC-1($NH_4OH+H_2O_2+H_2O$).

* * * * *